United States Patent
Zheng

(10) Patent No.: US 11,094,239 B2
(45) Date of Patent: Aug. 17, 2021

(54) SHIFT REGISTER AND DRIVING METHOD THEREOF, GATE DRIVING CIRCUIT AND DISPLAY DEVICE

(71) Applicant: BOE TECHNOLOGY GROUP CO., LTD., Beijing (CN)

(72) Inventor: Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/622,099

(22) PCT Filed: Jan. 25, 2019

(86) PCT No.: PCT/CN2019/073151
§ 371 (c)(1),
(2) Date: Dec. 12, 2019

(87) PCT Pub. No.: WO2019/154122
PCT Pub. Date: Aug. 15, 2019

(65) Prior Publication Data
US 2020/0184873 A1    Jun. 11, 2020

(30) Foreign Application Priority Data

Feb. 9, 2018    (CN) .......................... 201810136139.7

(51) Int. Cl.
*G09G 3/20*    (2006.01)
*G11C 19/18*    (2006.01)
*G11C 19/28*    (2006.01)

(52) U.S. Cl.
CPC ............ *G09G 3/20* (2013.01); *G11C 19/184* (2013.01); *G11C 19/28* (2013.01); *G09G 2310/0267* (2013.01); *G09G 2310/0286* (2013.01)

(58) Field of Classification Search
None
See application file for complete search history.

(56) References Cited

U.S. PATENT DOCUMENTS

| 8,497,855 B2 | 7/2013 | Park |
| 2010/0328281 A1 | 12/2010 | Okada et al. |

(Continued)

FOREIGN PATENT DOCUMENTS

| CN | 102629444 A | 8/2012 |
| CN | 102855858 A | 1/2013 |

(Continued)

OTHER PUBLICATIONS

The First Office Action with Search Report dated Jul. 2, 2019 corresponding to Chinese application No. 201810136139.7.

(Continued)

*Primary Examiner* — Ifedayo B Iluyomade
(74) *Attorney, Agent, or Firm* — Nath, Goldberg & Meyer; Joshua B. Goldberg

(57) ABSTRACT

A shift register and driving method thereof, a gate driving circuit and a display device are provided. The shift register includes a first input unit, a second input unit, a pull-up control unit, a pull-down control unit, an output control unit and an output reset unit, wherein the first input unit, the second input unit, the pull-up control unit, the pull-down control unit and the output control unit are coupled to a first node, and the pull-up control unit, the pull-down control unit and the output reset unit are coupled to a second node.

18 Claims, 8 Drawing Sheets

(56) References Cited

U.S. PATENT DOCUMENTS

2017/0186773 A1* 6/2017 Fan .................. G06F 3/0412
2018/0357974 A1* 12/2018 Zheng ................ G09G 3/36

FOREIGN PATENT DOCUMENTS

| CN | 103035296 A | | 4/2013 | |
| --- | --- | --- | --- | --- |
| CN | 104834427 | * | 8/2015 | ............ G06F 3/044 |
| CN | 104834427 A | | 8/2015 | |
| CN | 106023919 A | | 10/2016 | |
| CN | 201610754883 | * | 1/2017 | ............... G09G 3/36 |

OTHER PUBLICATIONS

The Second Office Action with Search Report dated Dec. 12, 2019 corresponding to Chinese application No. 201810136139.7.

* cited by examiner

SHIFT REGISTER AND DRIVING METHOD THEREOF, GATE DRIVING CIRCUIT AND DISPLAY DEVICE

CROSS REFERENCE TO RELATED APPLICATIONS

This is a National Phase Application filed under 35 U.S.C. 371 as a national stage of PCT/CN2019/073151, filed Jan. 25, 2019, an application claiming the benefit of Chinese Application No. 201810136139.7, filed Feb. 9, 2018, the content of each of which is hereby incorporated by reference in its entirety.

TECHNICAL FIELD

The present disclosure relates to the field of display technology, and in particular, to a shift register and a driving method thereof, a gate driving circuit, and a display device.

BACKGROUND

In the related art, a thin film transistor (TFT) gate switch circuit is integrated on an array substrate of a display panel by using a Gate Driver on Array (GOA) technology to form a scan driver for the display panel, so that a Gate Driver IC can be omitted.

SUMMARY

According to an aspect of the present disclosure, there is provided a shift register including: a first input unit, a second input unit, a pull-up control unit, a pull-down control unit, an output control unit, an output reset unit, a first control signal input terminal, a second control signal input terminal, a third control signal input terminal, a fourth control signal input terminal, a forward-scan input signal terminal, a reverse-scan input signal terminal, a first power supply terminal, a second power supply terminal, a third power supply terminal and a signal output terminal; the first input unit, the second input unit, the pull-up control unit, the pull-down control unit and the output control unit are coupled to a first node, and the pull-up control unit, the pull-down control unit and the output reset unit are coupled to a second node; the first input unit is configured to input a forward-scan input signal provided from the forward-scan input signal terminal to the first node under the control of a control signal provided from the first control signal input terminal; the second input unit is configured to input a reverse-scan input signal provided from the reverse-scan input signal terminal to the first node under the control of a control signal provided from the third control signal input terminal; the pull-up control unit is configured to input a control signal provided from the fourth control signal input terminal to the second node under the control of a potential of the first node, or is configured to input a first voltage provided from the first power supply terminal to the second node under the control of a control signal provided from the fourth control signal input terminal; the pull-down control unit is configured to input a second voltage provided from the second power supply terminal to the first node under the control of a potential of the second node; under the control of the potential of the first node, the output control unit is configured to input a control signal provided from the second control signal input terminal to the signal output terminal for the signal output terminal to output a scan signal; the output reset unit is configured to input a third voltage provided from the third power supply terminal to the signal output terminal under the control of the potential of the second node to reset the signal output terminal, and at least one of the control signal provided from the first control signal input terminal, the control signal provided from the second control signal input terminal, the control signal provided from the third control signal input terminal and the control signal provided from the fourth control signal input terminal is a clock signal.

In some embodiments, the control signal provided from the first control signal input terminal, the control signal provided from the second control signal input terminal, the control signal provided from the third control signal input terminal, and the control signal provided from the fourth control signal input terminal are all clock signals.

In some embodiments, the first input unit includes a first transistor, and a control electrode of the first transistor is coupled to the first control signal input terminal, a first electrode of the first transistor is coupled to the forward-scan input signal terminal, and a second electrode of the first transistor is coupled to the first node.

In some embodiments, the second input unit includes a second transistor, and a control electrode of the second transistor is coupled to the third control signal input terminal, a first electrode of the second transistor is coupled to the reverse-scan input signal terminal, and a second electrode of the second transistor is coupled to the first node.

In some embodiments, the pull-up control unit includes a third transistor and a fourth transistor, a control electrode of the third transistor is coupled to the first node, a first electrode of the third transistor is coupled to the fourth control signal input terminal, and a second electrode of the third transistor is coupled to the second node; and a control electrode of the fourth transistor is coupled to the fourth control signal input terminal, a first electrode of the fourth transistor is coupled to the first power supply terminal, and a second electrode of the fourth transistor is coupled to the second node.

In some embodiments, the pull-down control unit includes a fifth transistor, and a control electrode of the fifth transistor is coupled to the second node, a first electrode of the fifth transistor is coupled to the second power supply terminal, and a second electrode of the fifth transistor is coupled to the first node.

In some embodiments, the output control unit includes a sixth transistor and a first capacitor, a control electrode of the sixth transistor is coupled to the first node, a first electrode of the sixth transistor is coupled to the second control signal input terminal, and a second electrode of the sixth transistor is coupled to the signal output terminal; and a first terminal of the first capacitor is coupled to the first node, and a second terminal of the first capacitor is coupled to the signal output terminal.

In some embodiments, the output reset unit includes a seventh transistor and a second capacitor, a control electrode of the seventh transistor is coupled to the second node, a first electrode of the seventh transistor is coupled to the third power supply terminal, and a second electrode of the seventh transistor is coupled to the signal output terminal; and a first terminal of the second capacitor is coupled to the second node, and a second terminal of the second capacitor is coupled to the first electrode of the seventh transistor.

In some embodiments, the shift register further includes a first current cutoff unit, the first current cutoff unit is arranged between an output terminal of the first input unit and the first node and between an output terminal of the second input unit and the first node; and the first current cut-off unit is configured to decouple the first input unit from the first node and decouple the second input unit from the first node to prevent leakage current in the first input unit and the second input unit from affecting the potential of the first node in a case where the output control unit inputs the control signal provided from the second control signal input terminal to the signal output terminal under the control of the potential of the first node.

In some embodiments, the first current cutoff unit includes: an eighth transistor, a ninth transistor, and a tenth transistor, a control electrode of the eighth transistor is coupled to the signal output terminal, a first electrode of the eighth transistor is coupled to the second control signal input terminal, and a second electrode of the eighth transistor is coupled to both the output terminal of the first input unit and the output terminal of the second input unit; a control electrode of the ninth transistor is coupled to the first control signal input terminal, a first electrode of the ninth transistor is coupled to both the output terminal of the first input unit and the second electrode of the eighth transistor, and a second electrode of the ninth transistor is coupled to the first node; a control electrode of the tenth transistor is coupled to the third control signal input terminal, a first electrode of the tenth transistor is coupled to both the output terminal of the second input unit and the second electrode of the eighth transistor, and a second electrode of the tenth transistor is coupled to the first node.

In some embodiments, the shift register further includes a second current cutoff unit, the second current cutoff unit is arranged between an output terminal of the pull-down control unit and the first node; the second current cutoff unit is configured to couple the pull-down control unit from the first node to prevent leakage current in the pull-down control unit from affecting the potential of the first node in a case where the output control unit inputs the control signal provided from the second control signal input terminal to the signal output terminal under the control of the potential of the first node.

In some embodiments, the second current cutoff unit includes an eleventh transistor and a twelfth transistor, a control electrode of the eleventh transistor is coupled to the second node, a first electrode of the eleventh transistor is coupled to the output terminal of the pull-down control unit, and a second electrode of the eleventh transistor is coupled to the first node; a control electrode of the twelfth transistor is coupled to the first node, a first electrode of the twelfth transistor is coupled to the fourth power supply terminal, and a second electrode of the twelfth transistor is coupled to both the output terminal of the pull-down control unit and the first electrode of the eleventh transistor.

In some embodiments, the control signals respectively input to the first control signal input terminal, the second control signal input terminal, the third control signal input terminal and the fourth control signal input terminal are clock signals.

According to another aspect of the present disclosure, there is also provided a gate driving circuit including: a plurality of shift registers which are cascaded, each of the shift registers is the shift register above, the signal output terminal of the shift register of a stage, other than the shift register of a first stage and the shift register of a last stage, is coupled to the reverse-scan input signal terminal of the shift register of the previous stage and the forward-scan input signal terminal of the shift register of the next stage; the first control signal input terminal of the shift register of the $(4n-3)^{th}$ stage is coupled to the first clock signal line, the second control signal input terminal of the shift register of the $(4n-3)^{th}$ stage is coupled to the second clock signal line, the third control signal input terminal of the shift register of the $(4n-3)^{th}$ stage is coupled to the third clock signal line, and a fourth control signal input terminal of the shift register of the $(4n-3)^{th}$ stage is coupled to the fourth clock signal line; the first control signal input terminal of the shift register of the $(4n-2)^{th}$ stage is coupled to the second clock signal line, the second control signal input terminal of the shift register of the $(4n-2)^{th}$ stage is coupled to the third clock signal line, the third control signal input terminal of the shift register of the $(4n-2)^{th}$ stage is coupled to the fourth clock signal line, and the fourth control signal input terminal of the shift register of the $(4n-2)^{th}$ stage is coupled to the first clock signal line; the first control signal input terminal of the shift register of the $(4n-1)^{th}$ stage is coupled to the third clock signal line, the second control signal input terminal of the shift register of the $(4n-1)^{th}$ stage is coupled to the fourth clock signal line, the third control signal input terminal of the shift register of the $(4n-1)^{th}$ stage is coupled to the first clock signal line, and the fourth control signal input terminal of the shift register of the $(4n-1)^{th}$ stage is coupled to the second clock signal line; the first control signal input terminal of the shift register of the $(4n)^{th}$ stage is coupled to the fourth clock signal line, the second control signal input terminal of the shift register of the $(4n)^{th}$ stage is coupled to the first clock signal line, the third control signal input terminal of the shift register of the $(4n)^{th}$ stage is coupled to the second clock signal line, and the fourth control signal input terminal of the shift register of the $(4n)^{th}$ stage is coupled to the third clock signal line; and n is a positive integer.

According to still another aspect of the present disclosure, there is also provided a display device including the gate driving circuit described above.

According to still another aspect of the present disclosure, there is provided a forward driving method of a shift register, the shift register is the above shift register, the forward driving method includes: an input stage, in which the first input unit inputs a forward-scan input signal provided from the forward-scan input signal terminal to the first node under the control of the control signal provided from the first control signal input terminal, and the pull-up control unit inputs the control signal provided from the fourth control signal input terminal to the second node under the control of the potential of the first node; an output stage, in which under the control of the potential of the first node, the output control unit transmits the control signal provided from the second control signal input terminal to the signal output terminal for the signal output terminal to output a scan signal; and a reset stage, in which the pull-up control unit inputs a first voltage provided from the first power supply terminal to the second node under the control of the control signal provided from the fourth control signal input terminal, and the output reset unit inputs, under the control of the potential of the second node, a third voltage provided from the third power supply terminal to the signal output terminal to reset the signal output terminal.

The present disclosure also provides a reverse driving method of a shift register, where the shift register is the above shift register, and the reverse driving method includes: an input stage, in which the second input unit inputs the reverse-scan input signal provided from the reverse-scan input signal terminal to the first node under the control of the control signal provided from the third control signal input terminal, and the pull-up control unit inputs the control signal provided from the fourth control signal input terminal to the second node under the control of the potential of the first node; an output stage, in which under the control of the potential of the first node, the output control unit transmits the control signal provided from the second control signal input terminal to the signal output terminal for the signal output terminal to output a scan signal; and a reset stage, in which the pull-up control unit inputs the first voltage provided from the first power supply terminal to the second node under the control of the control signal provided from the fourth control signal input terminal, and the output reset unit inputs, under the control of the potential of the second node, the third voltage provided from the third power supply terminal to the signal output terminal to reset the signal output terminal.

DETAILED DESCRIPTION

In order to make those skilled in the art better understand the technical solutions of the present disclosure, a shift register and a driving method thereof, and a gate driving circuit provided in the present disclosure are described in detail below with reference to the accompanying drawings.

The GOA circuit is composed of a plurality of shift registers cascaded, and output terminals of the shift registers are respectively coupled to gates of switch transistors in the respective rows of pixel units to drive the pixel units in the respective rows.

However, the shift register in the GOA circuit in the related art can only support a unidirectional scan (a forward-scan or a reverse-scan), and cannot implement a bidirectional scan, which has certain limitations.

Figure 1:
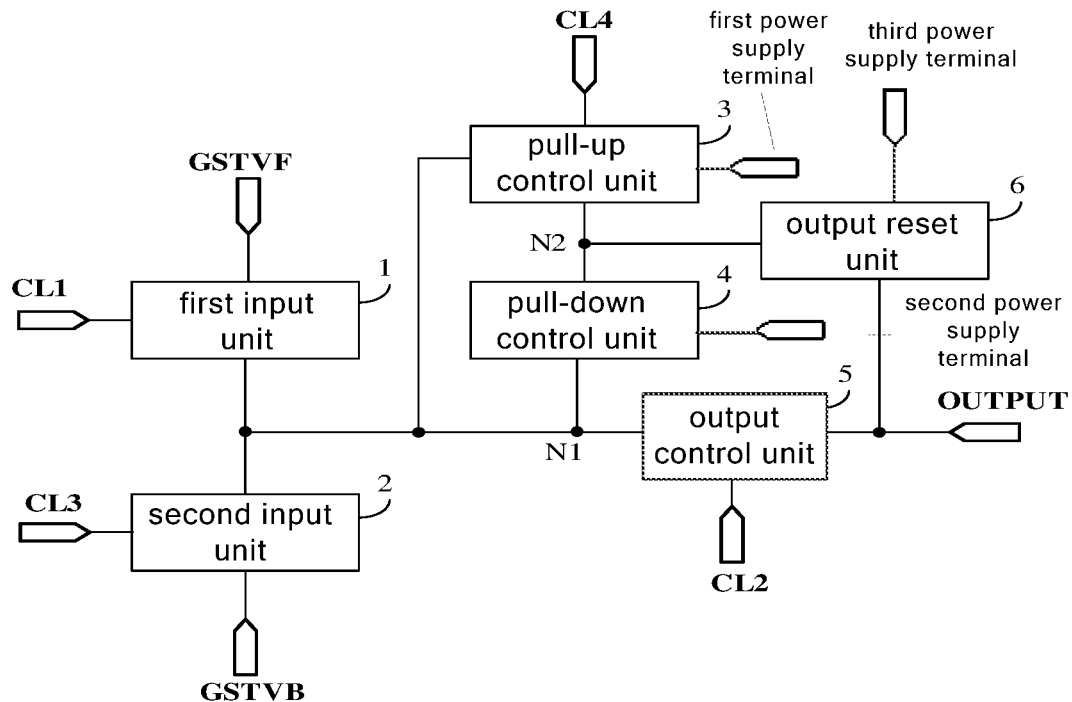
FIG. 1 is a schematic circuit diagram of a shift register according to some embodiments of the present disclosure.

To solve the above problem, according to an aspect of the present disclosure, there is provided a shift register. FIG. 1 is a schematic circuit diagram of a shift register according to some embodiments of the present disclosure.

As shown in FIG. 1, the shift register includes a first input unit 1, a second input unit 2, a pull-up control unit 3, a pull-down control unit 4, an output control unit 5, an output reset unit 6, a first control signal input terminal CL1, a second control signal input terminal CL2, a third control signal input terminal CL3, a fourth control signal input terminal CL4, a forward-scan input signal terminal GSTVF, a reverse-scan input signal terminal GSTVB, a first power supply terminal, a second power supply terminal, a third power supply terminal, and a signal output terminal OUTPUT. The first input unit 1, the second input unit 2, the pull-up control unit 3, the pull-down control unit 4, and the output control unit 5 are coupled to a first node N1, and the pull-up control unit 3, the pull-down control unit 4, and the output reset unit 6 are coupled to a second node N2.

The first input unit 1 is configured to input a forward-scan input signal provided from the forward-scan input signal terminal GSTVF to the first node N1 under the control of a control signal provided from the first control signal input terminal CL1.

The second input unit 2 is configured to input a reverse-scan input signal provided from the reverse-scan input signal terminal GSTVB to the first node N1 under the control of a control signal provided from the third control signal input terminal CL3.

The pull-up control unit 3 is configured to input a control signal provided from the fourth control signal input terminal CL4 to the second node N2 under the control of a potential of the first node N1, or input a first voltage provided from the first power supply terminal to the second node N2 under the control of the control signal provided from the fourth control signal input terminal CL4.

The pull-down control unit 4 is configured to input a second voltage supplied from the second power supply terminal to the first node N1 under the control of a potential of the second node N2.

The output control unit 5 is configured to input a control signal provided from the second control signal input terminal CL2 to the signal output terminal OUTPUT under the control of the potential of the first node N1 for outputting a scan signal by the signal output terminal OUTPUT.

The output reset unit 6 is configured to input a third voltage provided from the third power supply terminal to the signal output terminal OUTPUT under the control of the potential of the second node N2 to reset the signal output terminal OUTPUT.

In the present embodiment, in a case where the gate driving circuit performs a forward-scan (driving the gate lines one by one from the first gate line to the last gate line), an operation process of the shift register includes three stages: an input stage, an output stage and a reset stage.

In the input stage, the first input unit 1 inputs a forward-scan input signal provided from the forward-scan input signal terminal GSTVF to the first node N1 under the control of the control signal provided from the first control signal input terminal CL1; the pull-up control unit 3 inputs the control signal provided from the fourth control signal input terminal CL4 to the second node N2 under the control of the potential of the first node N1.

In the output stage, the output control unit 5 transmits the control signal provided from the second control signal input terminal CL2 to the signal output terminal OUTPUT under the control of the potential of the first node N1 for outputting the scan signal by the signal output terminal OUTPUT.

In the reset stage, the pull-up control unit 3 inputs the first voltage provided from the first power supply terminal to the second node N2 under the control of the control signal provided from the fourth control signal input terminal CL4; the output reset unit 6 inputs the third voltage provided from the third power supply terminal to the signal output terminal OUTPUT under the control of the potential of the second node N2 to reset the signal output terminal OUTPUT.

In a case where the gate driving circuit performs the reverse-scan (driving the gate lines one by one from the last gate line to the first gate line), an operation process of the shift register also includes three stages: an input stage, an output stage and a reset stage.

In the input stage T1, the second input unit 2 inputs the reverse-scan input signal provided from the reverse-scan input signal terminal GSTVB to the first node N1 under the control of the control signal provided from the third control signal input terminal CL3; the pull-up control unit 3 inputs the control signal provided from the fourth control signal input terminal CL4 to the second node N2 under the control of the potential of the first node N1.

In the output stage T2, the output control unit 5 transmits the control signal provided from the second control signal input terminal CL2 to the signal output terminal OUTPUT under the control of the potential of the first node N1 for outputting the scan signal by the signal output terminal OUTPUT.

In the reset stage T3, the pull-up control unit 3 inputs the first voltage provided from the first power supply terminal to the second node N2 under the control of the control signal provided from the fourth control signal input terminal CL4, and the output reset unit 6 inputs the third voltage supplied from the third power supply terminal to the signal output terminal OUTPUT under the control of the potential of the second node N2 to reset the signal output terminal OUTPUT.

In some embodiments of the present disclosure, at least one of the control signal provided from the first control signal input terminal CL1, the control signal provided from the second control signal input terminal CL2, the control signal provided from the third control signal input terminal CL3, and the control signal provided from the fourth control signal input terminal CL4 is a clock signal, that is, the control signals for respective input terminals are generated by controlling phase relationship between the clock signals, so that no additional high-voltage control signal is required, and the circuit structure is simple.

In some implementations of the present disclosure, the control signal provided from the first control signal input CL1, the control signal provided from the second control signal input CL2, the control signal provided from the third control signal input CL3, and the control signal provided from the fourth control signal input CL4 are all clock signals. Therefore, no additional high-voltage control signal is needed, and the circuit structure is simple.

Specific operation processes of the above units will be described later with reference to specific examples.

As can be seen from the above, in the technical solution of the present disclosure, the forward-scan input signal and the reverse-scan input signal are provided to the first node N1 by two input units, so that the shift register can implement a bidirectional scan, and further the gate driving circuit can implement the forward-scan and the reverse-scan.

Figure 2:
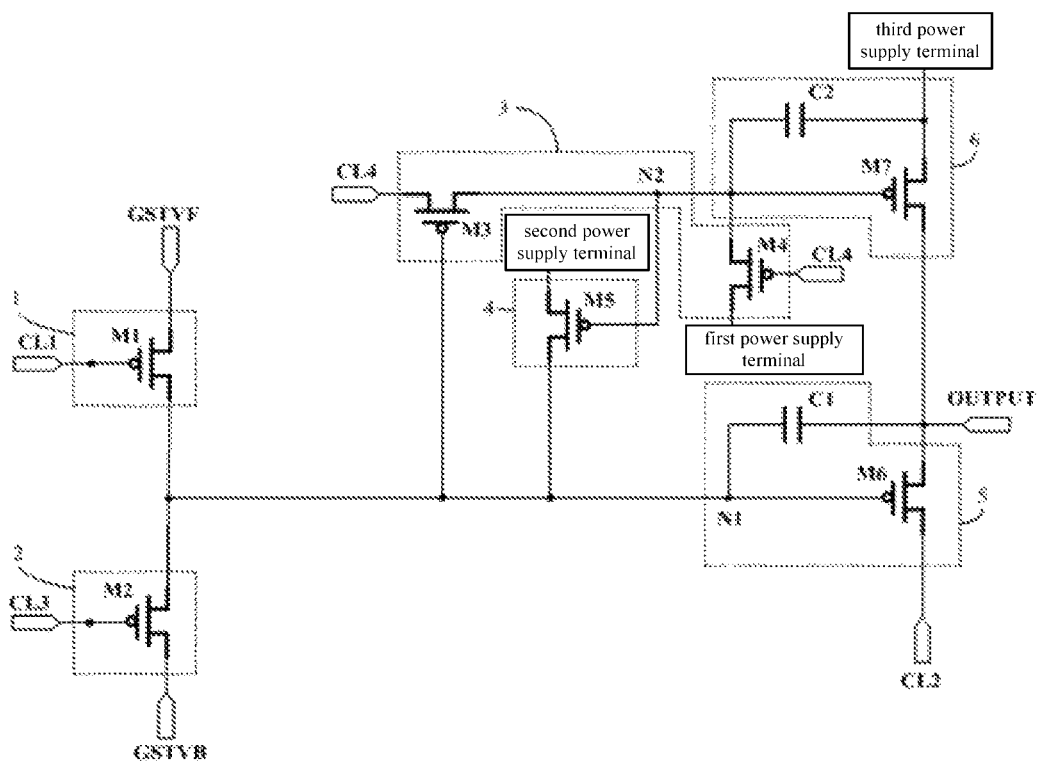
FIG. 2 is a schematic circuit diagram of a shift register according to some embodiments of the present disclosure.

FIG. 2 is a schematic circuit diagram of a shift register according to some embodiments of the present disclosure. The shift register shown in FIG. 2 is an embodiment based on the shift register shown in FIG. 1.

The first input unit 1 includes a first transistor M1. The first transistor M1 has a control electrode coupled to the first control signal input terminal CL1, a first electrode coupled to the forward-scan input signal terminal GSTVF, and a second electrode coupled to the first node N1.

The second input unit 2 includes a second transistor M2. The second transistor M2 has a control electrode coupled to the third control signal input terminal CL3, a first electrode coupled to the reverse-scan input signal terminal GSTVB, and a second electrode coupled to the first node N1.

In the present embodiment, the two input units are two independent transistors, and are used for inputting the forward-scan input signal or the reverse-scan input signal to the first node N1 under the control of the control signal provided from a corresponding control signal input terminal.

In some embodiments, the pull-up control unit 3 includes a third transistor M3 and a fourth transistor M4. A control electrode of the third transistor M3 is coupled to the first node N1, a first electrode of the third transistor M3 is coupled to the fourth control signal input terminal CL4, and the second electrode of the third transistor M3 is coupled to the second node N2. A control electrode of the fourth transistor M4 is coupled to the fourth control signal input terminal CL4, a first electrode of the fourth transistor M4 is coupled to the first power supply terminal, and a second electrode of the fourth transistor M4 is coupled to the second node N2.

In some embodiments, the pull-down control unit 4 includes a fifth transistor M5. A control electrode of the fifth transistor M5 is coupled to the second node N2, a first electrode of the fifth transistor M5 is coupled to the second power supply terminal, and a second electrode of the fifth transistor M5 is coupled to the first node N1.

In some embodiments, the output control unit 5 includes a sixth transistor M6 and a first capacitor C1. A control electrode of the sixth transistor M6 is coupled to the first node N1, a first electrode of the sixth transistor M6 is coupled to the second control signal input terminal CL2, and a second electrode of the sixth transistor M6 is coupled to the signal output terminal OUTPUT. The first capacitor C1 has a first terminal coupled to the first node N1 and a second terminal coupled to the signal output terminal OUTPUT.

In some embodiments, the output reset unit 6 includes a seventh transistor M7 and a second capacitor C2. A control electrode of the seventh transistor M7 is coupled to the second node N2, a first electrode of the seventh transistor M7 is coupled to the third power supply terminal, and a second electrode of the seventh transistor M7 is coupled to the signal output terminal OUTPUT. The second capacitor C2 has a first terminal coupled to the second node N2 and a second terminal coupled to the first electrode of the seventh transistor M7.

It should be noted that, the transistors in the present disclosure may be thin film transistors or field effect transistors or other switching devices with the same characteristics. The transistor generally includes three electrodes: a gate, a source and a drain, the source and the drain of the transistor are symmetrical in structure, and the source and drain may be interchanged as desired. In the present disclosure, the control electrode refers to the gate of the transistor, and one of the first electrode and the second electrode is a source and the other is the drain.

Further, the transistors may be classified into N-type transistors and P-type transistors according to characteristics of the transistors. In a case where the transistor is an N-type transistor, an ON voltage is a high-level voltage and an OFF voltage is a low-level voltage. In a case where the transistor is a P-type transistor, the ON voltage is the low-level voltage and the OFF voltage is the high-level voltage. In the embodiments of the present disclosure, description will be made by taking each transistor being a P-type transistor as an example. Accordingly, the first power supply terminal supplies a low-level operation voltage, and the second power supply terminal and the third power supply terminal supply a high-level operation voltage.

For convenience of description, in the present embodiment, the high-level voltage is denoted as VH, the low-level voltage is denoted as VL, and a threshold voltage of the P-type transistor is denoted as Vth (which is a negative value and slightly less than 0V).

Figure 3:
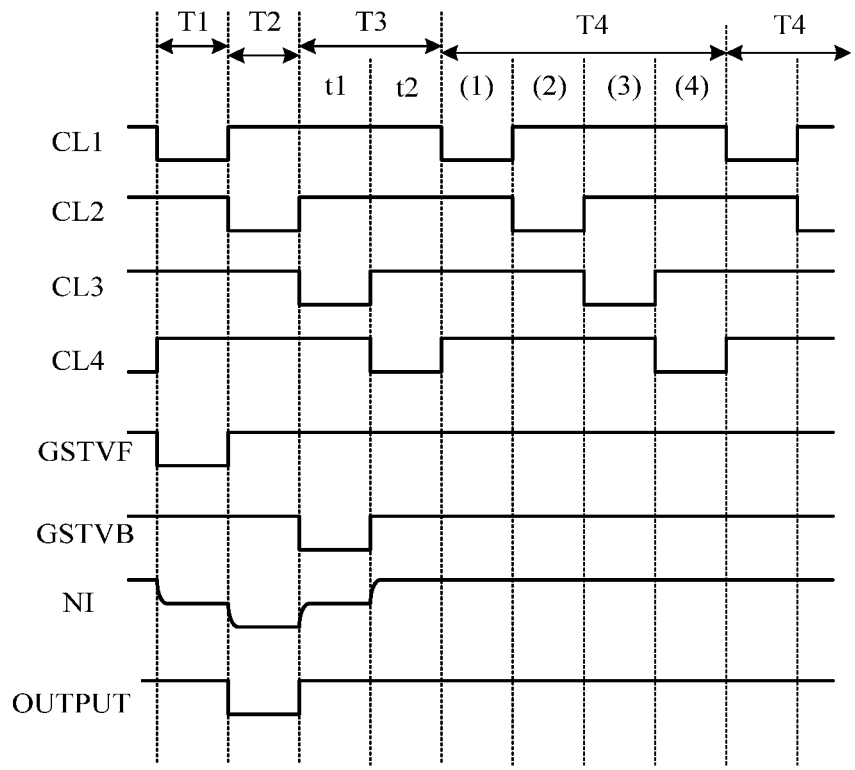
FIG. 3 is a timing diagram of an operation of the shift register shown in FIG. 2 during a forward-scan.

FIG. 3 is a timing diagram of an operation of the shift register shown in FIG. 2 during a forward-scan. As shown in FIG. 3, when the gate driving circuit performs the forward-scan, the first control signal input terminal CL1, the second control signal input terminal CL2, the third control signal input terminal CL3 and the fourth control signal input terminal CL4 provide clock signals (i.e., the clock signals are used as the control signals) with the same cycles and the same duty ratio (a ratio of a duration of an active potential to a duration of one cycle, in the present embodiment, the transistors are P-type transistors, and the active potential is a low level) of 25%, and the clock signal provided from the first control signal input terminal CL1 is used as a reference, the clock signal provided from the second control signal input terminal CL2 is delayed (a start time of the output of the active potential) by ¼ cycles compared with the clock signal provided from the first control signal input terminal CL1, the clock signal provided from the third control signal input terminal CL3 is delayed by 2/4 cycles compared with the clock signal provided from the first control signal input terminal CL1, the clock signal provided from the fourth control signal input CL4 is delayed by ¾ cycles compared with the clock signal provided from the first control signal input CL1.

In the input stage T1, the forward-scan input signal provided from the forward-scan input signal terminal GSTVF is at a low level, the reverse-scan input signal provided from the reverse-scan input signal terminal GSTVB is at a high level, the control signal provided from the first control signal input terminal CL1 is at a low level, the control signal provided from the second control signal input terminal CL2 is at a high level, the control signal provided from the third control signal input terminal CL3 is at a high level, and the control signal provided from the fourth control signal input terminal CL4 is at a high level.

Since the control signal provided from the first control signal input terminal CL1 is at the low level and the control signal provided from the third control signal input terminal CL3 is at the high level, the first transistor M1 is turned on and the second transistor M2 is turned off. At this time, the forward-scan input signal provided from the forward-scan input signal terminal GSTVF is written to the first node N1 through the first transistor M1. Since the forward-scan input signal is at the low level, a threshold loss occurs when the forward-scan input signal at the low level passes through the P-type transistor, and a voltage of the first node N1 is VL+|Vth|, and VL+|Vth| is still a low-level voltage.

Since the voltage of the first node N1 is a low-level voltage, the third transistor M3 and the sixth transistor M6 are both turned on. Since the third transistor M3 is turned on, the control signal at the high level provided from the fourth control signal input terminal CL4 is written into the second node N2 through the third transistor M3. Accordingly, the fifth transistor M5 and the seventh transistor M7 are turned off. Meanwhile, since the sixth transistor M6 is turned on, the control signal at the high level provided from the second control signal input terminal CL2 is transmitted to the signal output terminal OUTPUT through the sixth transistor M6, and the signal output terminal OUTPUT outputs a high-level voltage.

At this time, a voltage of the first terminal of the first capacitor C1 is VL+|Vth|, a voltage of the second terminal of the first capacitor C1 is VH, and a voltage difference between the two terminals is VH−VL−|Vth|.

In the output stage T2, the forward-scan input signal provided from the forward-scan input signal terminal GSTVF is at a high level, the reverse-scan input signal provided from the reverse-scan input signal terminal GSTVB is at a high level, the control signal provided from the first control signal input terminal CL1 is at a high level, the control signal provided from the second control signal input terminal CL2 is at a low level, the control signal provided from the third control signal input terminal CL3 is at a high level, and the control signal provided from the fourth control signal input terminal CL4 is at a high level.

Since the control signal provided from the first control signal input terminal CL1 is at the high level, the first transistor M1 is turned off. Since the control signal provided from the third control signal input terminal CL3 is at the high level, the second transistor M2 is turned off. At this time, the first node N1 is in a floating state.

Since the control signal provided from the second control signal input terminal CL2 is at the low level, the signal output terminal OUTPUT outputs a low level signal, a voltage of which is VL. That is, the voltage at the second terminal of the first capacitor drops from VH to VL. Since the bootstrap action of the first capacitor C1 (maintaining the voltage difference between the two terminals constant), the voltage at the first terminal of the first capacitor drops to 2VL−VH+|Vth| (that is, a lower potential). That is, the voltage of the first node N1 is 2VL−VH+|Vth| to maintain the sixth transistor M6 to be better turned on.

The third transistor M3 is maintained to be turned on, and the fourth transistor M4, the fifth transistor M5, and the seventh transistor M7 continue to maintain to be turned off.

The reset stage T3 includes a first reset sub-stage T1 and a second reset sub-stage T2.

In the first reset sub-stage t1, the forward-scan input signal provided from the forward-scan input signal terminal GSTVF is at a high level, the reverse-scan input signal provided from the reverse-scan input signal terminal GSTVB is at a low level, the control signal provided from the first control signal input terminal CL1 is at a high level, the control signal provided from the second control signal input terminal CL2 is at a high level, the control signal provided from the third control signal input terminal CL3 is at a low level, and the control signal provided from the fourth control signal input terminal CL4 is at a high level.

Since the control signal provided from the first control signal input terminal CL1 is at the high level and the control signal provided from the third control signal input terminal CL3 is at the low level, the first transistor M1 is turned off and the second transistor M2 is turned on. At this time, the reverse-scan input signal provided from the reverse-scan input signal terminal GSTVB is written to the first node N1 through the second transistor M2. Since the reverse-scan input signal is at a low level, a threshold loss occurs when the reverse-scan input signal at the low level passes through the P-type transistor, and the voltage of the first node N1 is VL+|Vth|. VL+|Vth| is still a low-level voltage, and the third transistor M3 and the sixth transistor M6 are both maintained to be turned on. The control signal at the high level provided from the second control signal input terminal CL2 is transmitted to the signal output terminal OUTPUT through the sixth transistor M6. The signal output terminal OUTPUT outputs a high-level voltage to reset the signal output terminal OUTPUT.

The third transistor M3 is maintained to be turned on, and the fourth transistor M4, the fifth transistor M5, and the seventh transistor M7 continue to be maintained to be turned off.

However, when the signal output terminal OUTPUT is reset by using the high potential of the control signal, it is difficult to make the voltage of the signal output terminal OUTPUT actually reach VH because the current is small and the charging time is short. Therefore, it is necessary to actually reset the signal output terminal OUTPUT using a power supply outputting a high-level voltage.

In the second reset sub-stage t2, the forward-scan input signal provided from the forward-scan input signal terminal GSTVF is at a high level, the reverse-scan input signal provided from the reverse-scan input signal terminal GSTVB is at a high level, the control signal provided from the first control signal input terminal CL1 is at a high level, the control signal provided from the second control signal input terminal CL2 is at a high level, the control signal provided from the third control signal input terminal CL3 is at a high level, and the control signal provided from the fourth control signal input terminal CL4 is at a low level.

Since the control signal provided from the first control signal input terminal CL1 is at the high level and the control signal provided from the third control signal input terminal CL3 is at the high level, both the first transistor M1 and the second transistor M2 are turned off.

Since the control signal provided from the fourth control signal input terminal CL4 is at the low level, the fourth transistor M4 is turned on. The low-level operation voltage supplied from the first power supply terminal is written to the second node N2 through the fourth transistor M4. The voltage of the second node N2 is VL, and both the fifth transistor M5 and the seventh transistor M7 are turned on.

Since the fifth transistor M5 is turned on, the high-level operation voltage supplied from the second power supply terminal is written into the first node N1 through the fifth transistor M5. The voltage of the first node N1 becomes VH, and at this time, the sixth transistor M6 is turned off.

Since the seventh transistor M7 is turned on, the high-level operation voltage provided from the third power supply terminal is written into the signal output terminal OUTPUT through the seventh transistor M7, so as to actually reset the signal output terminal OUTPUT. At this time, the voltage of the first terminal and the second terminal of the first capacitor C1 are both VH.

In a case where the gate driving circuit performs the forward-scan, the shift register provided from the present disclosure can complete the steps of inputting, outputting and resetting through the above process.

It should be noted that, in this embodiment, after the reset stage T3, the method further includes: in a maintenance stage T4, the shift register continues to output a high level.

The maintenance stage T4 specifically includes four different operating states: (1) the control signal provided from the first control signal input terminal CL1 is at a low level, and the control signals provided from the other control signal input terminals are at a high level; (2) the control signal provided from the second control signal input terminal CL2 is at a low level, and the control signals provided from the other control signal input terminals are at a high level; (3) the control signal provided from the third control signal input terminal CL3 is at a low level, and the control signals provided from the other control signal input terminals are at a high level; (4) the control signal provided from the fourth control signal input CL4 is at a low level and the control signals provided from the other control signal input terminals are at a high level. In the above four different operating states, the forward-scan input signal provided from the forward-scan input signal terminal GSTVF is always at a high level, and the reverse-scan input signal provided from the reverse-scan input signal terminal GSTVB is always at a high level.

In the operating state (1), the first transistor M1 is turned on. The forward-scan input signal at the high level is written to the first node N1 through the first transistor M1 to maintain the voltage of the first node N1 at VH (the sixth transistor M6 is maintained to be turned off). The voltage of the signal output terminal OUTPUT may be maintained at VH by the first capacitor C1.

In the operating state (2), since the sixth transistor M6 is turned off, the voltage of the signal output terminal OUTPUT is not affected by the change of the control signal provided from the second control signal input terminal CL2.

In the operating state (3), the second transistor M2 is turned on. The reverse-scan input signal at the high level is written to the first node N1 through the second transistor M2 to maintain the voltage of the first node N1 at VH. The voltage of the signal output terminal OUTPUT can be maintained at VH by the first capacitor C1.

In the operating state (4), the fourth transistor M4 is turned on. The low-level operation voltage supplied from the first power supply terminal is written to the second node N2 through the fourth transistor M4. Accordingly, the fifth transistor M5 is turned on. The high-level operation voltage provided from the second power supply terminal is written to the first node N1 through the fifth transistor M5 to maintain the voltage of the first node N1 at VH. The voltage of the signal output terminal OUTPUT may be maintained at VH by the first capacitor C1.

It can be seen that, in the maintenance stage T4, the voltage of the first node N1 is maintained at VH by the forward-scan input signal, the reverse-scan input signal and the high-level operation voltage supplied from the second power supply terminal, respectively. Meanwhile, the voltage of the signal output terminal OUTPUT can be maintained at VH by the first capacitor C1.

By repeating the maintenance stage T4, the signal output terminal OUTPUT continues to stably output the high-level voltage until the forward-scan input signal changes to be at a low level, and then the input stage T1 is performed again.

Figure 4:
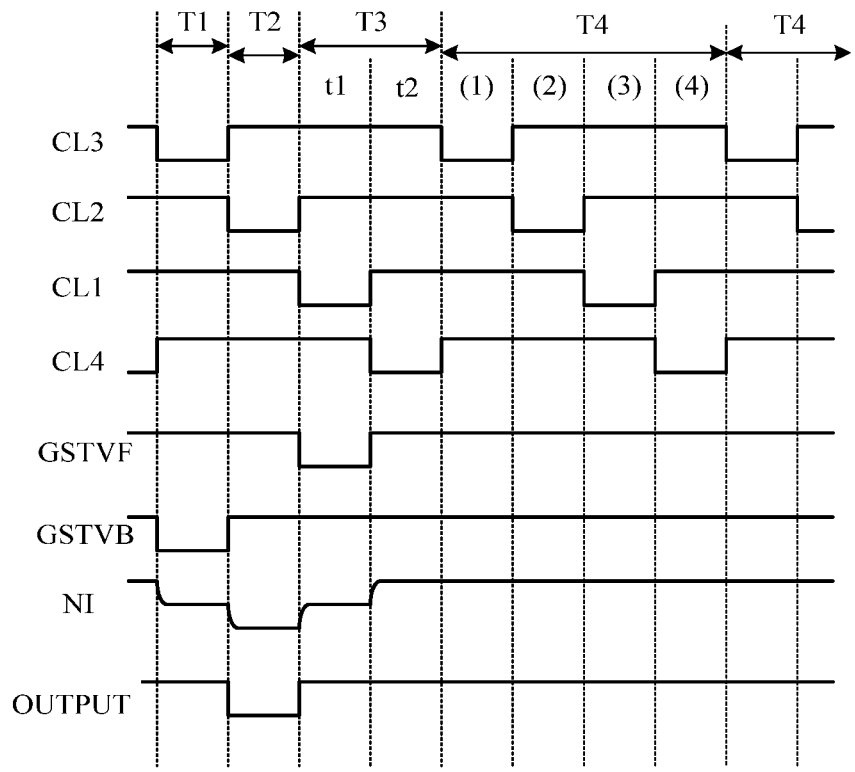
FIG. 4 is a timing diagram of an operation of the shift register shown in FIG. 2 during a reverse-scan.

FIG. 4 is a timing chart of an operation of the shift register shown in FIG. 2 during a reverse-scan. As shown in FIG. 4, when the gate driving circuit performs the reverse-scan, the first control signal input terminal CL1, the second control signal input terminal CL2, the third control signal input terminal CL3 and the fourth control signal input terminal CL4 provide clock signals (i.e. the clock signals are used as the control signals) with the same cycle and the duty ratio of 25%, and the clock signal provided from the third control signal input terminal CL3 are used as a reference, the clock signal provided from the second control signal input terminal CL2 is delayed by ¼ cycles compared with the clock signal provided from the third control signal input terminal CL2, the clock signal provided from the first control signal input terminal CL1 is delayed by ⅔ cycles compared with the clock signal provided from the third control signal input terminal CL3, and the clock signal provided from the fourth control signal input terminal CL4 is delayed by ¾ cycles compared with the clock signal provided from the third control signal input CL3.

In the input stage T1, the forward-scan input signal provided from the forward-scan input signal terminal GSTVF is at a high level, the reverse-scan input signal provided from the reverse-scan input signal terminal GSTVB is at a low level, the control signal provided from the first control signal input terminal CL1 is at a high level, the control signal provided from the second control signal input terminal CL2 is at a high level, the control signal provided from the third control signal input terminal CL3 is at a low level, and the control signal provided from the fourth control signal input terminal CL4 is at a high level.

Since the control signal provided from the first control signal input terminal CL1 is at the high level and the control signal provided from the third control signal input terminal CL3 is at the low level, the first transistor M1 is turned off and the second transistor M2 is turned on. At this time, the reverse-scan input signal provided from the reverse-scan input signal terminal GSTVB is written to the first node N1 through the second transistor M2. Since the reverse-scan input signal is at the low level, a threshold loss occurs when the reverse-scan input signal at the low level passes through the P-type transistor, and the voltage of the first node N1 is VL+|Vth|, and VL+|Vth| is still a low-level voltage.

Since the voltage of the first node N1 is a low-level voltage, the third transistor M3 and the sixth transistor M6 are both turned on. Since the third transistor M3 is turned on, the control signal at the high level provided from the fourth control signal input terminal CL4 is written into the second node N2 through the third transistor M3. Accordingly, the fifth transistor M5 and the seventh transistor M7 are turned off. Meanwhile, since the sixth transistor M6 is turned on, the control signal at the high level provided from the second control signal input terminal CL2 is transmitted to the signal output terminal OUTPUT through the sixth transistor M6, and the signal output terminal OUTPUT outputs a high-level voltage.

At this time, the voltage of the first terminal of the first capacitor C1 is VL+|Vth|, the voltage of the second terminal is VH, and the voltage difference between the two terminals is VH−VL−|Vth|.

In the output stage T2, the forward-scan input signal provided from the forward-scan input signal terminal GSTVF is at a high level, the reverse-scan input signal provided from the reverse-scan input signal terminal GSTVB is at a high level, the control signal provided from the first control signal input terminal CL1 is at a high level, the control signal provided from the second control signal input terminal CL2 is at a low level, the control signal provided from the third control signal input terminal CL3 is at a high level, and the control signal provided from the fourth control signal input terminal CL4 is at a high level.

Since the control signal provided from the first control signal input terminal CL1 is at the high level, the first transistor M1 is turned off. Since the control signal provided from the third control signal input terminal CL3 is at the high level, the second transistor M2 is turned off. At this time, the first node N1 is in a floating state.

Since the control signal provided from the second control signal input terminal CL2 is at the low level, the signal output terminal OUTPUT outputs a low level voltage, which is VL. That is, the voltage of the second terminal of the first capacitor drops from VH to VL. Under the bootstrap action of the first capacitor C1 (maintaining the voltage difference between the two terminals unchanged), the voltage of the first terminal of the first capacitor drops to 2VL−VH+|Vth|. That is, the voltage of the first node N1 is 2VL−VH+|Vth| to maintain the sixth transistor M6 to be better turned on.

The third transistor M3 is maintained to be turned on, and the fourth transistor M4, the fifth transistor M5, and the seventh transistor M7 continue to be maintained to be turned off.

The reset stage T3 includes a first reset sub-stage t1 and a second reset sub-stage t2.

In the first reset sub-stage t1, the forward-scan input signal provided from the forward-scan input signal terminal GSTVF is at a low level, the reverse-scan input signal provided from the reverse-scan input signal terminal GSTVB is at a high level, the control signal provided from the first control signal input terminal CL1 is at a low level, the control signal provided from the second control signal input terminal CL2 is at a high level, the control signal provided from the third control signal input terminal CL3 is at a high level, and the control signal provided from the fourth control signal input terminal CL4 is at a high level.

Since the control signal provided from the first control signal input terminal CL1 is at the low level and the control signal provided from the third control signal input terminal CL3 is at the high level, the first transistor M1 is turned on and the second transistor M2 is turned off. At this time, the forward-scan input signal provided from the forward-scan input signal terminal GSTVF is written to the first node N1 through the first transistor M1. Since the forward-scan input signal is at the low level, a threshold loss occurs when the forward-scan input signal at the low level passes through the P-type transistor. At this time, the voltage of the first node N1 is VL+|Vth|. VL+|Vth| is still a low-level voltage, and the third transistor M3 and the sixth transistor M6 are both maintained to be turned on. The control signal at the high level provided from the second control signal input terminal CL2 is transmitted to the signal output terminal OUTPUT through the sixth transistor M6 to reset the signal output terminal OUTPUT.

The third transistor M3 maintains the ON state, and the fourth transistor M4, the fifth transistor M5, and the seventh transistor M7 continue to maintain the OFF state.

In the second reset sub-stage t2, the forward-scan input signal provided from the forward-scan input signal terminal GSTVF is at a high level, the reverse-scan input signal provided from the reverse-scan input signal terminal GSTVB is at a high level, the control signal provided from the first control signal input terminal CL1 is at a high level, the control signal provided from the second control signal input terminal CL2 is at a high level, the control signal provided from the third control signal input terminal CL3 is at a high level, and the control signal provided from the fourth control signal input terminal CL4 is at a low level.

Since the control signal provided from the first control signal input terminal CL1 is at the high level and the control signal provided from the third control signal input terminal CL3 is at the high level, both the first transistor M1 and the second transistor M2 are turned off.

Since the control signal provided from the fourth control signal input terminal CL4 is at the low level, the fourth transistor M4 is turned on. The low-level operation voltage supplied from the first power supply terminal is written to the second node N2 through the fourth transistor M4. The voltage of the second node N2 is VL, and both the fifth transistor M5 and the seventh transistor M7 are turned on.

Since the fifth transistor M5 is turned on, the high-level operation voltage supplied from the second power supply terminal is written into the first node N1 through the fifth transistor M5. The voltage of the first node N1 becomes VH, and at this time, the sixth transistor M6 is turned off.

Since the seventh transistor M7 is turned on, the high-level operation voltage provided from the third power supply terminal is written into the signal output terminal OUTPUT through the seventh transistor M7, so as to totally reset the signal output terminal OUTPUT. At this time, the voltages of the first terminal and the second terminal of the first capacitor C1 are both VH.

When the gate driving circuit performs the reverse-scan, the shift register provided from the present disclosure can complete the steps of inputting, outputting, and resetting through the above processes. Certainly, the reset stage T3 may also be followed by the maintenance stage T4. In the maintenance stage T4, the shift register continues to output a high level. The specific operation process of the shift register in the maintenance stage T4 in the reverse-scan is the same as the specific operation process of the shift register in the maintenance stage T4 in the forward-scan, and the detailed description thereof is omitted here.

In the present embodiment, the control signals provided from the control signal input terminals are clock signals, and no additional high-voltage control signal is required, so that the power consumption can be effectively reduced. In addition, by adjusting the phase relationship between the clock signals, the gate driving circuit can be controlled to perform the forward-scan or the reverse-scan, and the specific process can be referred to the following description.

Figure 5:
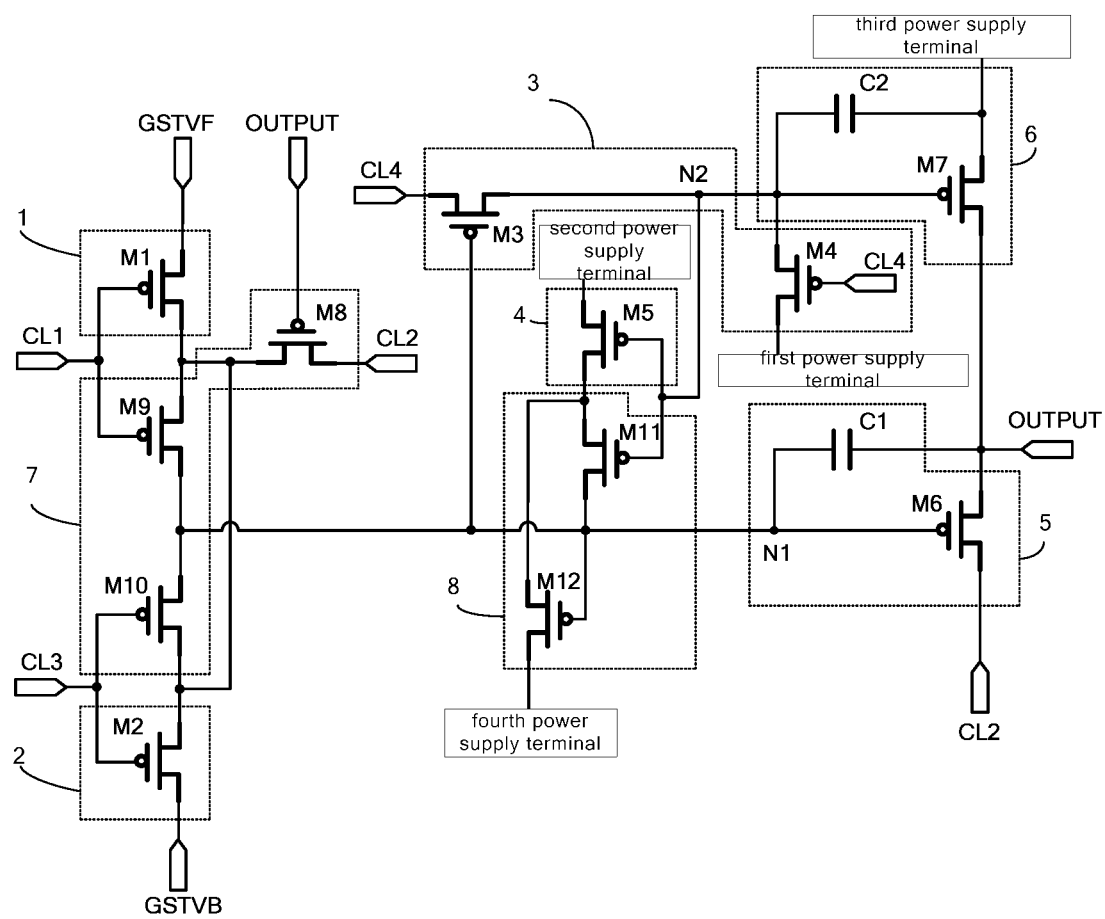
FIG. 5 is a schematic circuit diagram of a shift register according to some embodiments of the present disclosure.

FIG. 5 is a schematic circuit diagram of a shift register according to some embodiments of the present disclosure. As shown in FIG. 5, unlike the above-described embodiments, the shift register provided in the present embodiment further includes a first current cutoff unit 7.

The first current cutoff unit 7 is disposed between an output terminal of the first input unit 1 for outputting the forward-scan input signal and the first node N1, and between an output terminal of the second input unit 2 for outputting the reverse-scan input signal and the first node N1. When the output control unit 5 inputs the control signal at an active potential provided from the second control signal input terminal CL2 to the signal output terminal OUTPUT (i.e., the output stage T2) under the control of the potential of the first node N1, the first current cutoff unit 7 is configured to cutoff a connection between the first input unit 1 and the first node N1 and a connection between the second input unit 2 and the first node N1, thereby preventing the leakage current in the first input unit 1 and the second input unit 2 from affecting the potential of the first node N1.

In some embodiments, the first current cutoff unit 7 includes an eighth transistor M8, a ninth transistor M9, and a tenth transistor M10.

A control electrode of the eighth transistor M8 is coupled to the signal output terminal OUTPUT, a first electrode of the eighth transistor M8 is coupled to the second control signal input terminal CL2, and a second electrode of the eighth transistor M8 is coupled to both the output terminal of the first input unit 1 for outputting the forward-scan input signal and the output terminal of the second input unit 2 for outputting the reverse-scan input signal.

A control electrode of the ninth transistor M9 is coupled to the first control signal input terminal CL1, a first electrode of the ninth transistor M9 is coupled to both the output terminal of the first input unit 1 for outputting the forward-scan input signal and the second electrode of the eighth transistor M8, and the second electrode of the ninth transistor M9 is coupled to the first node N1.

A control electrode of the tenth transistor M10 is coupled to the third control signal input terminal CL3, a first electrode of the tenth transistor M10 is coupled to both the output terminal of the second input unit 2 for outputting the reverse-scan input signal and the second electrode of the eighth transistor M8, and a second electrode of the tenth transistor M10 is coupled to the first node N1.

As shown in FIG. 5, during the circuit design, for example, the ninth transistor M9 and the first transistor M1 are designed to be symmetrical, and the second transistor M2 and the tenth transistor M10 are designed to be symmetrical, so that the circuit design can be simplified.

In some embodiments, as shown in FIG. 5, the shift register provided in the present embodiment further includes a second current cutoff unit 8.

The second current cutoff unit 8 is disposed between an output terminal of the pull-down control unit 4 for outputting the second voltage and the first node N1. The second current cutoff unit 8 is configured to cutoff a connection between the output pull-down control unit 4 and the first node N1 when the output control unit 5 inputs the control signal at the active potential provided from the second control signal input terminal CL2 to the signal output terminal OUTPUT under the control of the potential of the first node N1 (i.e., in the output stage T2), so as to prevent the leakage current in the pull-down control unit 4 from affecting the potential of the first node N1.

In some embodiments, the second current cutoff unit 8 includes an eleventh transistor M11 and a twelfth transistor M12.

A control electrode of the eleventh transistor M11 is coupled to the second node N2, a first electrode of the eleventh transistor M11 is coupled to the output terminal of the pull-down control unit 4 for outputting the second voltage, and a second electrode of the eleventh transistor M11 is coupled to the first node N1.

A control electrode of the twelfth transistor M12 is coupled to the first node N1, a first electrode of the twelfth transistor M12 is coupled to the fourth power supply terminal, and a second electrode of the twelfth transistor M12 is coupled to both the output terminal of the pull-down control unit 4 for outputting the second voltage and the first electrode of the eleventh transistor M11.

Only operations of the first current cutoff unit 7 and the second current cutoff unit 8 at each stage will be described in detail below. The fourth power supply terminal supplies a low-level operation voltage VL.

The forward-scan process of the gate driving circuit is taken as an example.

In the input stage T1, since the signal output terminal OUTPUT outputs a high level, the eighth transistor M8 is turned off. Since the control signal provided from the first control signal input terminal CL1 is at a low level and the control signal provided from the third control signal input terminal CL3 is at a high level, the ninth transistor M9 is turned on and the tenth transistor M10 is turned off. The forward-scan input signal may be written to the first node N1 through the first transistor M1 and the ninth transistor M9 in sequence.

Since the first node N1 is at a low level, the twelfth transistor M12 is turned on. The low-level operation voltage supplied from the fourth power supply terminal is written to the first electrode of the eleventh transistor M11 through the twelfth transistor M12. Also, since the second node N2 is at a high level in the input stage T1, the eleventh transistor M11 is turned off. The pull-down control unit 4 is decoupled from the first node N1, so that the leakage current in the pull-down control unit 4 can be prevented from affecting the potential of the first node N1. In addition, since voltages of the first and second electrodes of the eleventh transistor M11 are both at a low level, the first node N1 cannot be discharged through the eleventh transistor M11.

In the output stage T2, since the signal output terminal OUTPUT outputs a low level, the eighth transistor M8 is turned on. The low level supplied from the second control signal input terminal CL2 is written to the first electrode of the ninth transistor M9 and the first electrode of the tenth transistor M10 through the eighth transistor M8. Meanwhile, since the control signal provided from the first control signal input terminal CL1 is at a high level and the control signal provided from the third control signal input terminal CL3 is at a high level, both the ninth transistor M9 and the tenth transistor M10 are turned off. The first input unit 1 is decoupled from the first node N1 and the second input unit 2 is decoupled from the first node N1, so that the leakage current in the first input unit 1 and the second input unit 2 can be prevented from affecting the potential of the first node N1. In addition, since the voltages of the first and second electrodes of the ninth transistor M9 are both at a low level and the voltages of the first and second electrodes of the tenth transistor M10 are both at a low level, the first node N1 can not be discharged through the ninth transistor M9 or the tenth transistor M10.

Meanwhile, the twelfth transistor M12 is kept turned on, the eleventh transistor M11 is kept turned off, and the first electrode and the second electrode of the eleventh transistor M11 both have low level voltages, so that the pull-down control unit 4 is decoupled from the first node N1, and the first node N1 can not be discharged through the eleventh transistor M11.

In the output stage T2, the transistors coupled to the first node N1 are all in the OFF state, and no discharge occurs, so that the voltage of the first node N1 can be maintained stable.

In the reset stage T3, since the signal output terminal OUTPUT outputs a high level, the eighth transistor M8 is turned off. Since the control signal provided from the first control signal input terminal CL1 is at a high level and the control signal provided from the third control signal input terminal CL3 is at a high level, the ninth transistor M9 and the tenth transistor M10 are both turned off.

Meanwhile, since the first node N1 is at a low level, the twelfth transistor M12 keeps turned on. Since the second node N2 is at a high level, the eleventh transistor M11 keeps turned off.

When the gate driving circuit performs the reverse-scan, the first current cutoff unit 7 and the second current cutoff unit 8 can discouple the first node N1 from the first input unit 1, the second input unit 2, and the pull-down control unit 4 in the output stage T2, so that the voltage of the first node N1 maintains stable, and the detailed process is not repeated here.

Figure 6:
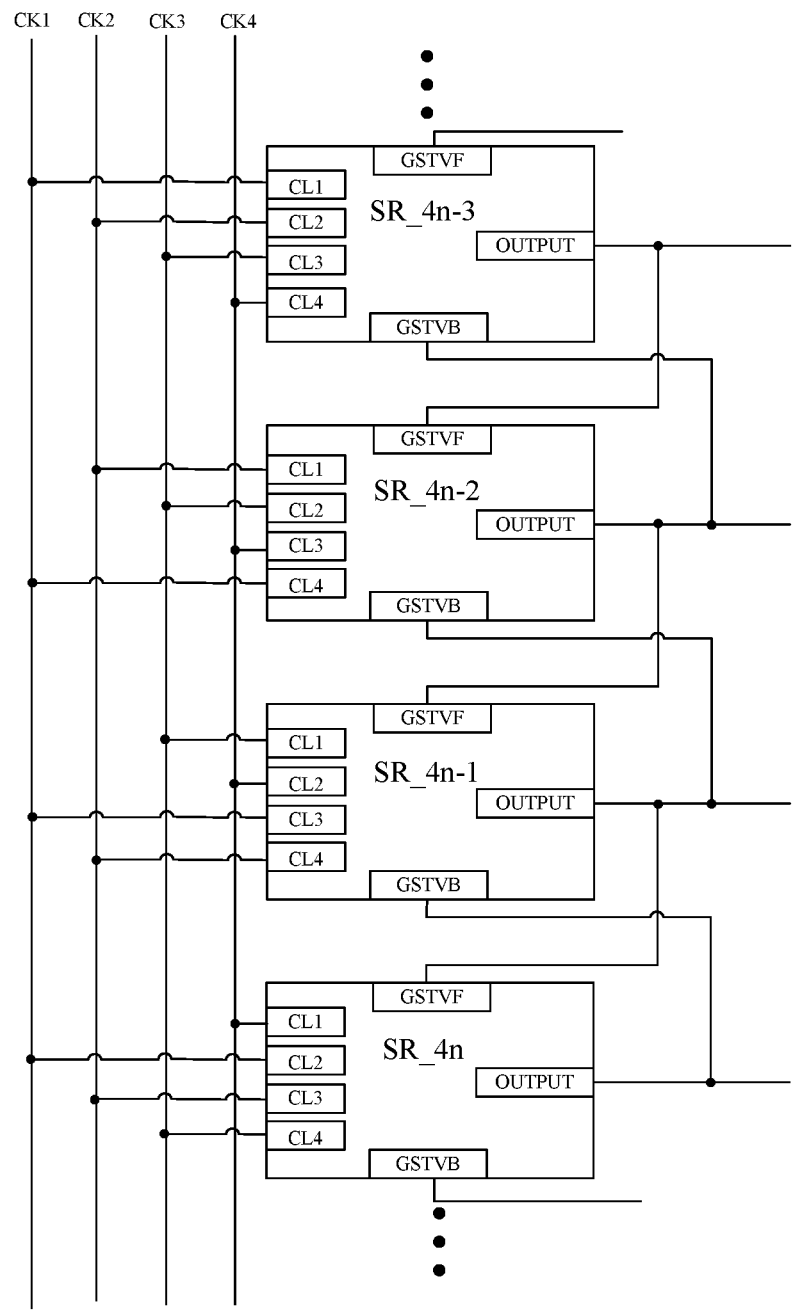
FIG. 6 is a schematic structural diagram of a gate driving circuit according to some embodiments of the present disclosure.

FIG. 6 is a schematic structural diagram of a gate driving circuit according to some embodiments of the present disclosure. As shown in FIG. 6, the gate driving circuit includes a plurality of shift registers cascaded, and a first clock signal line, a second clock signal line, a third clock signal line, and a fourth clock signal line, which are respectively coupled to the plurality of shift registers and used for providing clock signals, and each of the shift registers is the shift register provided in the above-described embodiment. For the specific structure of the shift register, detailed description is omitted here.

In the present embodiment, it is assumed that the number of the shift registers is 4N, where N is a preset positive integer. Except for the shift register of the first stage and the shift register of the last stage, the signal output terminal OUTPUT of the shift register of the present stage is coupled to the reverse-scan input signal terminal GSTVB of the shift register of the previous stage and the forward-scan input signal terminal GSTVF of the shift register of the next stage. n is a positive integer in [1, N].

The first control signal input terminal CL1 of the shift register SR_4n−3 of the $(4n-3)^{th}$ stage is coupled to the first clock signal line CK1, the second control signal input terminal CL2 of the shift register SR_4n−3 of the $(4n-3)^{th}$ stage is coupled to the second clock signal line CK2, the third control signal input terminal CL3 of the shift register SR_4n−3 of the $(4n-3)^{th}$ stage is coupled to the third clock signal line CK3, and the fourth control signal input terminal CL4 of the shift register SR_4n−3 of the $(4n-3)^{th}$ stage is coupled to the fourth clock signal line CK4.

The first control signal input terminal CL1 of the shift register SR_4n−2 of the $(4n-2)^{th}$ stage is coupled to the second clock signal line CK2, the second control signal input terminal CL2 of the shift register SR_4n−2 of the $(4n-2)^{th}$ stage is coupled to the third clock signal line CK3, the third control signal input terminal CL3 of the shift register SR_4n−2 of the $(4n-2)^{th}$ stage is coupled to the fourth clock signal line CK4, and the fourth control signal input terminal CL4 of the shift register SR_4n−2 of the $(4n-2)^{th}$ stage is coupled to the first clock signal line CK1.

The first control signal input terminal CL1 of the shift register SR_4n−1 of the $(4n-1)^{th}$ stage is coupled to the third clock signal line CK3, the second control signal input terminal CL2 of the shift register SR_4n−1 of the $(4n-1)^{th}$ stage is coupled to the fourth clock signal line CK4, the third control signal input terminal CL3 of the shift register SR_4n−1 of the $(4n-1)^{th}$ stage is coupled to the first clock signal line CK1, and the fourth control signal input terminal CL4 of the shift register SR_4n−1 of the $(4n-1)^{th}$ stage is coupled to the second clock signal line CK2.

The first control signal input terminal CL1 of the shift register SR_4n of the $(4n)^{th}$ stage is coupled to the fourth clock signal line CK4, the second control signal input terminal CL2 of the shift register SR_4n of the $(4n)^{th}$ stage is coupled to the first clock signal line CK1, the third control signal input terminal CL3 of the shift register SR_4n of the $(4n)^{th}$ stage is coupled to the second clock signal line CK2, and the fourth control signal input terminal CL4 of the shift register SR_4n of the $(4n)^{th}$ stage is coupled to the third clock signal line CK3.

Figure 7:
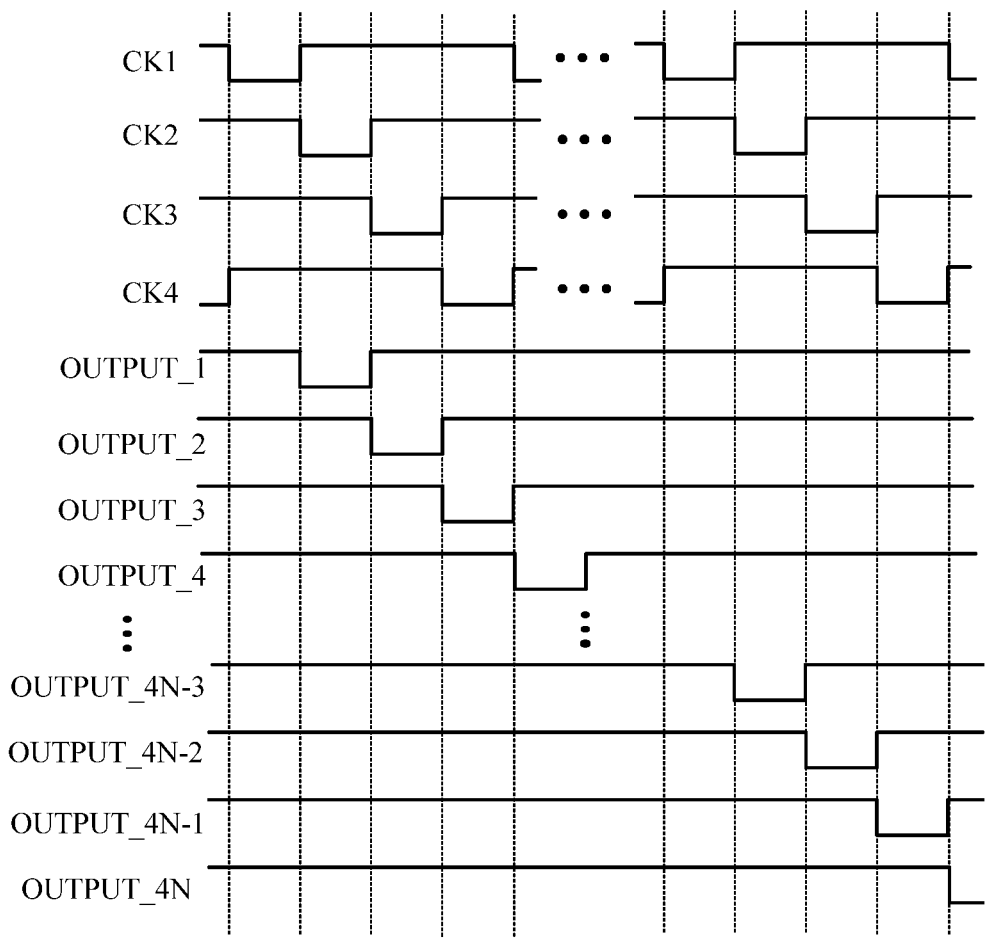
FIG. 7 is a timing diagram of an operation of the gate driving circuit shown in FIG. 6 during a forward-scan.

FIG. 7 is a timing chart of the gate driving circuit shown in FIG. 6 during the forward-scan. As shown in FIG. 7, when the gate driving circuit performs the forward-scan, the first clock signal line CK1, the second clock signal line CK2, the third clock signal line CK3, and the fourth clock signal line CK4 provide clock signals (i.e., the clock signals are used as the control signals) with the same cycle and same duty ratio (in this embodiment, the transistors are P-type transistors, and the active potential refers to a low level voltage) of 25%. The clock signal provided from the first clock signal line CK1 is used as a reference, the clock signal provided from the second clock signal line CK2 is delayed by ¼ cycles compared with the clock signal provided from the first clock line CK1, the clock signal provided from the third clock line CK3 is delayed by 2/4 cycles compared with the clock signal provided from the first clock line CK1, and the clock signal provided from the fourth clock line CK4 is delayed by ¾ cycles compared with the clock signal provided from the first clock line CK1.

When the gate driving circuit performs the forward-scan, as can be seen from the foregoing, after the active potential is input to the corresponding forward-scan input signal terminal GSTVF of the shift register of a respective stage, and when the control signal provided from the corresponding second control signal input terminal CL2 is at the active potential (taking a low level being the active potential as an example), the active potential is output from the signal output terminal OUTPUT of the shift register.

When each stage of shift register is in the corresponding output stage, the shift registers of the $1^{st}$ to $4^{th}$ stages are taken as examples, the signal output terminal OUTPUT_1 of the shift register SR_1 of the $1^{st}$ stage outputs the clock signal at the active potential provided from the second clock signal line CK2, and supplies the forward-scan input signal to the shift register SR_2 of the $2^{nd}$ stage. The signal output terminal OUTPUT_2 of the shift register SR_2 of the $2^{nd}$ stage outputs the clock signal at the active potential provided from the third clock signal line CK3, and provides the forward-scan input signal to the shift register SR_3 of the $3^{rd}$ stage. The signal output terminal OUTPUT_3 of the shift register SR_3 of the $3^{rd}$ stage outputs the clock signal at the active potential provided from the fourth clock signal line CK4, and provides the forward-scan input signal to the shift register SR_4 of the $4^{th}$ stage. The signal output terminal OUTPUT_4 of the shift register SR_4 of the $4^{th}$ stage outputs the clock signal at the active potential provided from the first clock signal line CK1, and provides the forward-scan input signal to the shift register of the $5^{th}$ stage.

Similarly, the second control signal input terminal CL2 of the shift register SR_4n−3 of the $(4n-3)^{th}$ stage is coupled to the second clock signal line CK2 and provides the forward-scan input signal to the shift register SR_4n−2 of the $(4n-2)^{th}$ stage. The second control signal input terminal CL2 of the shift register SR_4n−2 of the $(4n-2)^{th}$ stage is coupled to the third clock signal line CK3 and provides the forward-scan input signal to the shift register SR_4n−1 of the $(4n-1)^{th}$ stage. The second control signal input terminal CL2 of the shift register SR_4n−1 of the $(4n-1)^{th}$ stage is coupled to the fourth clock signal line CK4 and provides the forward-scan input signal to the shift register SR_4n of the $(4n)^{th}$ stage. The second control signal input terminal CL2 of the shift register SR_4n of the $(4n)^{th}$ stage is coupled to the first clock signal line CK1 and provides the forward-scan input signal to the shift register SR_4n+1 of the $(4n+1)^{th}$ stage. Since the clock signals provided from the clock signal line CK1, the clock signal line CK2, the clock signal line CK3 and the clock signal line CK4 are delayed by ¼ cycles in turn, so that the signal output terminals of the shift register SR_4n−3 of the $(4n-3)^{th}$ stage, the shift register SR_4n−2 of the $(4n-2)^{th}$ stage, the shift register SR_4n−1 of the $(4n-1)^{th}$ stage and the shift register SR_4n of the $(4n)^{th}$ stage sequentially output the effective potential, namely the forward-scan is carried out.

Figure 8:
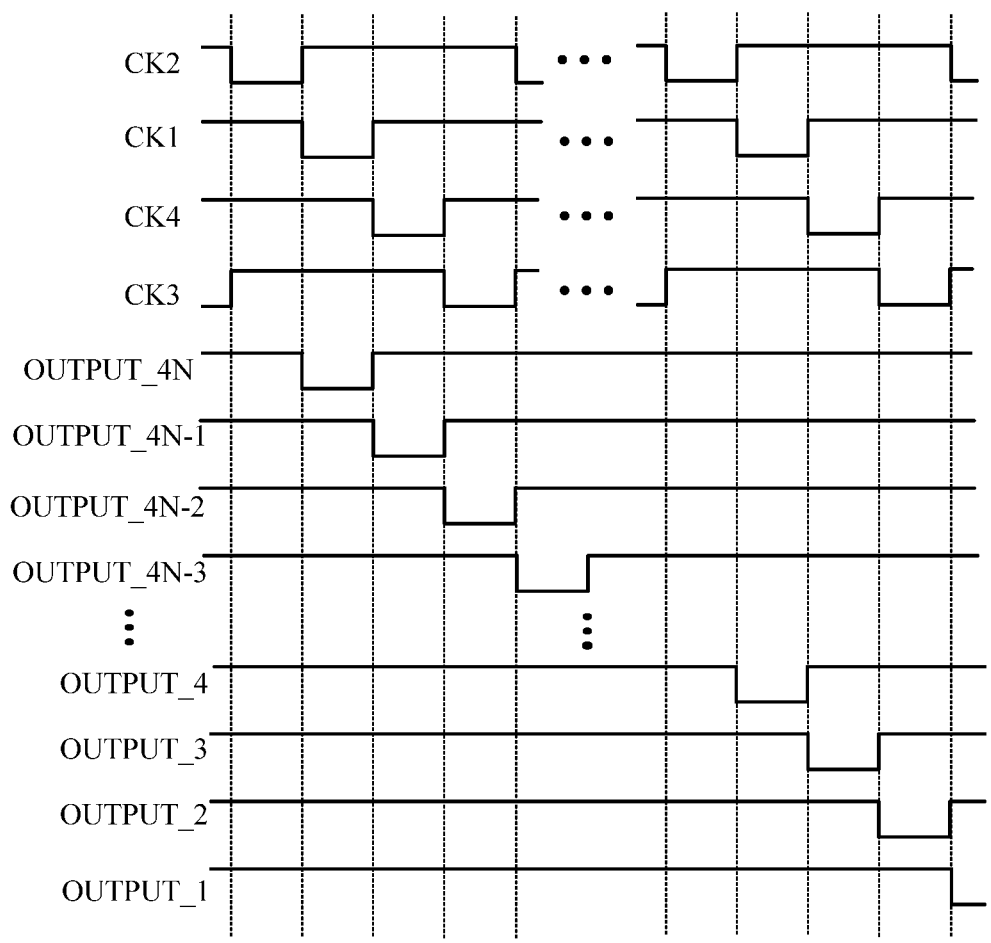
FIG. 8 is a timing diagram of an operation of the gate driving circuit shown in FIG. 6 during a reverse-scan.

FIG. 8 is a timing chart of the gate driving circuit shown in FIG. 6 during the reverse-scan. As shown in FIG. 8, when the gate driving circuit performs the reverse-scan, the first clock signal line CK1, the second clock signal line CK2, the third clock signal line CK3, and the fourth clock signal line CK4 provide clock signals (i.e., the clock signals are used as the control signals) with the same cycles and same duty ratios (in this embodiment, the transistors are P-type transistors, and the active potential refers to a low level voltage) of 25%. The clock signal provided from the second clock signal line CK2 is used as a reference, the first clock signal provided from the first clock signal line CK1 is delayed by ¼ cycles compared with the clock signal supplied from the second clock line CK2, the clock signal provided from the fourth clock line CK4 is delayed by 2/4 cycles compared with the clock signal supplied from the second clock line CK2, and the clock signal provided from the third clock line CK3 is delayed by ¾ cycles compared with the clock signal supplied from the second clock line CK2.

When the gate driving circuit performs the reverse-scan, as can be seen from the foregoing, after the active potential is input to the reverse-scan input signal terminal GSTVB of the shift register of each stage, and when the control signal provided from the corresponding second control signal input terminal CL2 is at the active potential (taking the low level being the active potential as an example), the shift register signal output terminal OUTPUT of the shift register outputs the active potential.

In a case where shift registers of the respective stages are in the corresponding output stage, the shift registers of the $(4N)^{th}$ to $(4N-3)^{th}$ stages are taken as an example. The signal output terminal OUTPUT_4N of the shift register of the $(4N)^{th}$ stage outputs the clock signal at the active potential provided from the first clock signal line CK1, and provides the reverse-scan input signal to the shift register of the $(4N-1)^{th}$ stage. The signal output terminal OUTPUT_4N−1 of the shift register of the $(4N-1)^{th}$ stage outputs the clock signal at the active potential provided from the fourth clock signal line CK4, and provides the reverse-scan input signal to the shift register of the $(4N-2)^{th}$ stage. The signal output terminal OUTPUT_4N−2 of the shift register of the $(4N-2)^{th}$ stage outputs the clock signal at the active potential provided from the third clock signal line CK3, and provides the reverse-scan input signal to the shift register of the $(4N-3)^{th}$ stage. The signal output terminal OUTPUT_4N−3 of the shift register of the $(4N-3)^{th}$ stage outputs the clock signal at the active potential provided from the second clock signal line CK2, and provides the reverse-scan input signal to the shift register of the $(4N-4)^{th}$ stage.

And so on, the shift register SR_4n of the $(4n)^{th}$ stage outputs the clock signal at the active potential provided from the first clock signal line CK1, and provides the reverse-scan input signal to the shift register SR_4n−1 of the $(4n-1)^{th}$ stage. The shift register SR_4n−1 of the $(4n-1)^{th}$ stage outputs the clock signal at the active potential provided from the fourth clock signal line CK4, and provides the reverse-scan input signal to the shift register SR_4n−2 of the $(4n-2)^{th}$ stage. The shift register SR_4n−2 of the $(4n-2)^{th}$ stage outputs the clock signal at the active potential provided from the third clock signal line CK3, and provides the reverse-scan input signal to the shift register SR_4n−3 of the $(4n-3)^{th}$ stage. The shift register SR_4n−3 of the $(4n-3)^{th}$ stage outputs the clock signal at the active potential provided from the second clock signal line CK2, and provides the reverse-scan input signal to the shift register SR_4n−4 of the $(4n-4)^{th}$ stage. Since the clock signals provided from the second clock signal line CK2, the first clock signal line CK1, the four clock signal line CK4 and the third clock signal line CK3 are delayed by ¼ cycles in turn, the shift register SR_4n of the $(4n)^{th}$ stage, the shift register SR_4n−1 of the $(4n-1)^{th}$ stage, the shift register SR_4n−2 of the $(4n-2)^{th}$ stage and the shift register SR_4n−3 of the $(4n-3)^{th}$ stage sequentially output the active potentials, namely, the reverse-scan is carried out.

The gate driving circuit provided in the present disclosure can realize the forward-scan by controlling the first clock signal line CK1, the second clock signal line CK2, the third clock signal line CK3, and the fourth clock signal line CK4 to sequentially output active potentials. The reverse-scan can also be realized by controlling the second clock signal line CK2, the first clock signal line CK1, the fourth clock signal line CK4, and the third clock signal line CK3 to sequentially output active potentials. It can be seen that the gate driving circuit provided in the present disclosure can support a bidirectional scanning function.

According to some embodiments of the present disclosure, there is also provided a display device employing the gate driving circuit as shown in FIG. 6 above.

Figure 9:
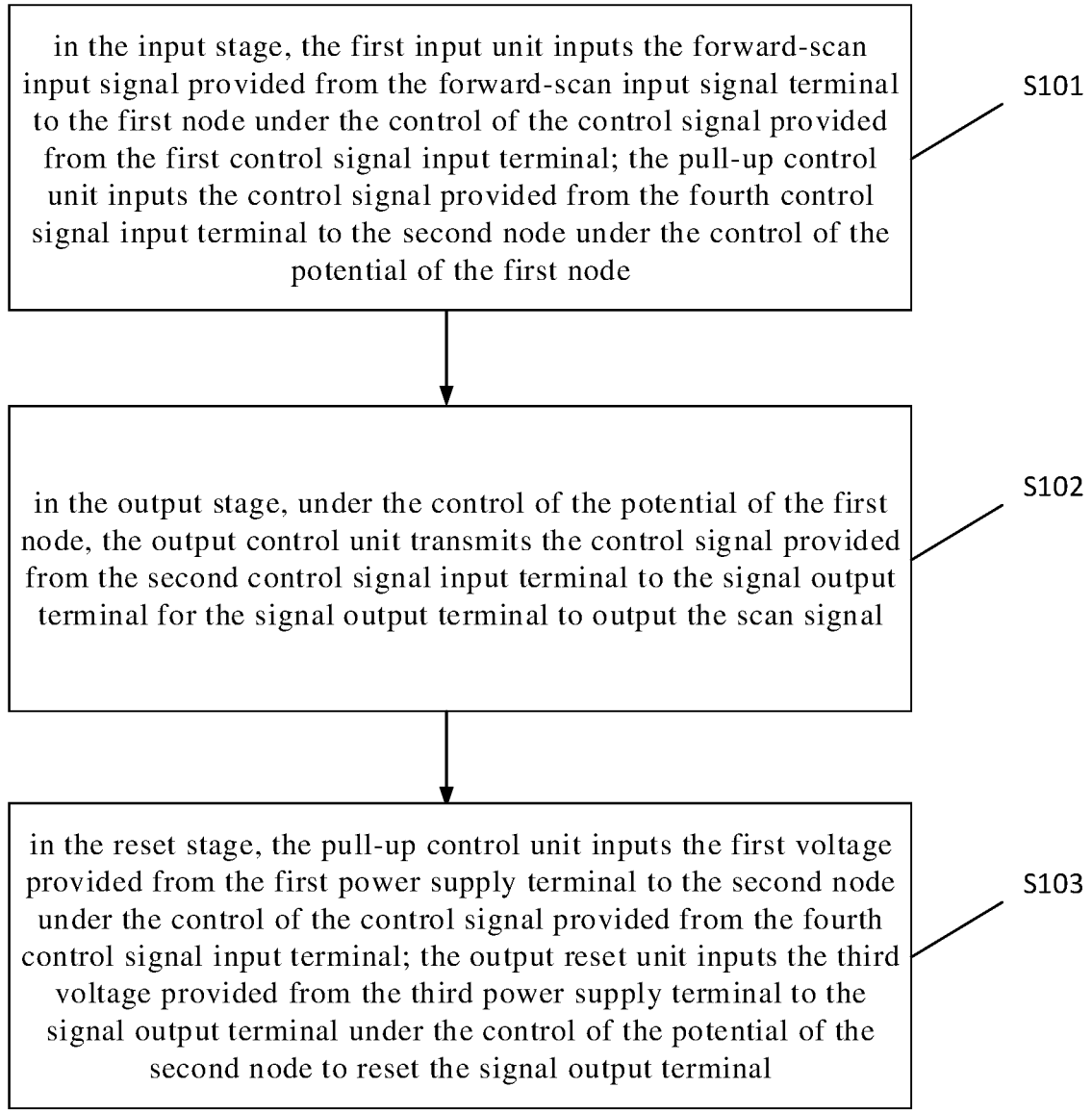
FIG. 9 is a flowchart of a forward driving method of a shift register according to some embodiments of the present disclosure.

FIG. 9 is a flowchart of a forward driving method of a shift register according to some embodiments of the present disclosure. As shown in FIG. 9, the shift register is the shift register in the above-described embodiment, and the forward driving method includes the following steps.

In step S101, in the input stage, the first input unit inputs the forward-scan input signal provided from the forward-scan input signal terminal to the first node under the control of the control signal provided from the first control signal input terminal; the pull-up control unit inputs the control signal provided from the fourth control signal input terminal to the second node under the control of the potential of the first node.

In step S102, in the output stage, under the control of the potential of the first node, the output control unit transmits the control signal provided from the second control signal input terminal to the signal output terminal for the signal output terminal to output the scan signal.

In step S103, in the reset stage, the pull-up control unit inputs the first voltage provided from the first power supply terminal to the second node under the control of the control signal provided from the fourth control signal input terminal; the output reset unit inputs the third voltage provided from the third power supply terminal to the signal output terminal under the control of the potential of the second node to reset the signal output terminal.

For the specific description of the steps S101 to S103, reference may be made to the corresponding contents in the foregoing embodiments, and details thereof are not repeated here.

Figure 10:
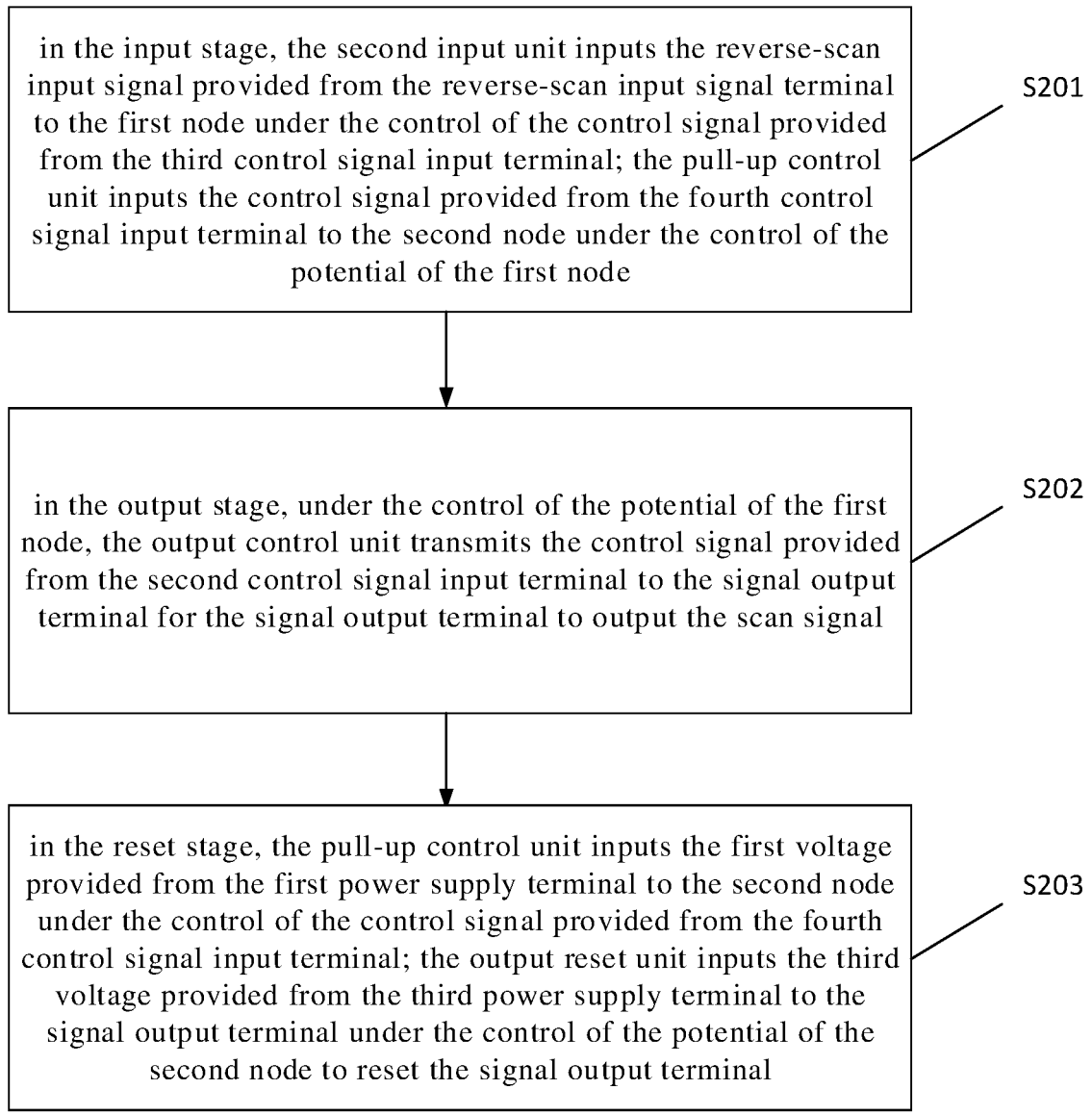
FIG. 10 is a flowchart of a reverse driving method of a shift register according to some embodiments of the present disclosure.

FIG. 10 is a flowchart of a reverse driving method of a shift register according to some embodiments of the present disclosure. As shown in FIG. 10, the shift register is the shift register in the above embodiment, and the reverse driving method includes the following steps.

In step S201, in the input stage, the second input unit inputs the reverse-scan input signal provided from the reverse-scan input signal terminal to the first node under the control of the control signal provided from the third control signal input terminal; the pull-up control unit inputs the control signal provided from the fourth control signal input terminal to the second node under the control of the potential of the first node.

In step S202, in the output stage, under the control of the potential of the first node, the output control unit transmits the control signal provided from the second control signal input terminal to the signal output terminal for the signal output terminal to output the scan signal.

In step S203, in the reset stage, the pull-up control unit inputs the first voltage provided from the first power supply terminal to the second node under the control of the control signal provided from the fourth control signal input terminal; the output reset unit inputs the third voltage provided from the third power supply terminal to the signal output terminal under the control of the potential of the second node to reset the signal output terminal.

For the specific description of the steps S201 to S203, reference may be made to the corresponding contents in the foregoing embodiments, and details thereof are not repeated here.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A shift register, comprising: a first input unit, a second input unit, a pull-up control unit, a pull-down control unit, an output control unit, an output reset unit, a first control signal input terminal, a second control signal input terminal, a third control signal input terminal, a fourth control signal input terminal, a forward-scan input signal terminal, a reverse-scan input signal terminal, a first power supply terminal, a second power supply terminal, a third power supply terminal and a signal output terminal, wherein the first input unit, the second input unit, the pull-up control unit, the pull-down control unit and the output control unit are coupled to a first node, and the pull-up control unit, the pull-down control unit and the output reset unit are coupled to a second node;

the first input unit is configured to input a forward-scan input signal provided from the forward-scan input signal terminal to the first node under the control of a control signal provided from the first control signal input terminal;

the second input unit is configured to input a reverse-scan input signal provided from the reverse-scan input signal terminal to the first node under the control of a control signal provided from the third control signal input terminal;

the pull-up control unit is configured to input a control signal provided from the fourth control signal input terminal to the second node under the control of a potential of the first node, or is configured to input a first voltage provided from the first power supply terminal to the second node under the control of a control signal provided from the fourth control signal input terminal;

the pull-down control unit is configured to input a second voltage provided from the second power supply terminal to the first node under the control of a potential of the second node;

under the control of the potential of the first node, the output control unit is configured to input a control signal provided from the second control signal input terminal to the signal output terminal for the signal output terminal to output a scan signal;

under the control of the potential of the second node, the output reset unit is configured to input a third voltage provided from the third power supply terminal to the signal output terminal to reset the signal output terminal, and at least one of the control signal provided from the first control signal input terminal, the control signal provided from the second control signal input terminal, the control signal provided from the third control signal input terminal and the control signal provided from the fourth control signal input terminal is a clock signal, wherein the pull-up control unit comprises a third transistor and a fourth transistor, a control electrode of the third transistor is coupled to the first node, a first electrode of the third transistor is coupled to the fourth control signal input terminal, and a second electrode of the third transistor is coupled to the second node; and a control electrode of the fourth transistor is coupled to the fourth control signal input terminal, a first electrode of the fourth transistor is coupled to the first power supply terminal, and a second electrode of the fourth transistor is coupled to the second node.

2. The shift register of claim 1, wherein the control signal provided from the first control signal input terminal, the control signal provided from the second control signal input terminal, the control signal provided from the third control signal input terminal, and the control signal provided from the fourth control signal input terminal are all clock signals.

3. The shift register of claim 2, wherein the first input unit comprises: a first transistor, and
a control electrode of the first transistor is coupled to the first control signal input terminal, a first electrode of the first transistor is coupled to the forward-scan input signal terminal, and a second electrode of the first transistor is coupled to the first node.

4. The shift register of claim 3, wherein the second input unit comprises a second transistor, and
a control electrode of the second transistor is coupled to the third control signal input terminal, a first electrode of the second transistor is coupled to the reverse-scan input signal terminal, and a second electrode of the second transistor is coupled to the first node.

5. The shift register of claim 1, wherein the pull-down control unit includes a fifth transistor, and
a control electrode of the fifth transistor is coupled to the second node, a first electrode of the fifth transistor is coupled to the second power supply terminal, and a second electrode of the fifth transistor is coupled to the first node.

6. The shift register of claim 5, wherein the output control unit includes a sixth transistor and a first capacitor,
a control electrode of the sixth transistor is coupled to the first node, a first electrode of the sixth transistor is coupled to the second control signal input terminal, and a second electrode of the sixth transistor is coupled to the signal output terminal; and
a first terminal of the first capacitor is coupled to the first node, and a second terminal of the first capacitor is coupled to the signal output terminal.

7. The shift register of claim 6, wherein the output reset unit includes a seventh transistor and a second capacitor,
a control electrode of the seventh transistor is coupled to the second node, a first electrode of the seventh transistor is coupled to the third power supply terminal, and a second electrode of the seventh transistor is coupled to the signal output terminal; and
a first terminal of the second capacitor is coupled to the second node, and a second terminal of the second capacitor is coupled to the first electrode of the seventh transistor.

8. The shift register of claim 7, further comprising: a first current cutoff unit, wherein
the first current cutoff unit is arranged between an output terminal of the first input unit and the first node and between an output terminal of the second input unit and the first node; and
the first current cut-off unit is configured to decouple the first input unit from the first node and decouple the second input unit from the first node to prevent leakage current in the first input unit and the second input unit from affecting the potential of the first node in a case where the output control unit inputs the control signal provided from the second control signal input terminal to the signal output terminal under the control of the potential of the first node.

9. The shift register of claim 8, wherein the first current cutoff unit comprises: an eighth transistor, a ninth transistor, and a tenth transistor, and
a control electrode of the eighth transistor is coupled to the signal output terminal, a first electrode of the eighth transistor is coupled to the second control signal input terminal, and a second electrode of the eighth transistor is coupled to both the output terminal of the first input unit and the output terminal of the second input unit;
a control electrode of the ninth transistor is coupled to the first control signal input terminal, a first electrode of the ninth transistor is coupled to both the output terminal of the first input unit and the second electrode of the eighth transistor, and a second electrode of the ninth transistor is coupled to the first node;
a control electrode of the tenth transistor is coupled to the third control signal input terminal, a first electrode of the tenth transistor is coupled to both the output terminal of the second input unit and the second electrode of the eighth transistor, and a second electrode of the tenth transistor is coupled to the first node.

10. The shift register of claim 9, further comprising a second current cutoff unit, wherein
the second current cutoff unit is arranged between an output terminal of the pull-down control unit and the first node;
the second current cutoff unit is configured to decouple the pull-down control unit from the first node to prevent leakage current in the pull-down control unit from affecting the potential of the first node in a case where the output control unit inputs the control signal provided from the second control signal input terminal to the signal output terminal under the control of the potential of the first node.

11. The shift register of claim 10, wherein the second current cutoff unit comprises: an eleventh transistor and a twelfth transistor,
a control electrode of the eleventh transistor is coupled to the second node, a first electrode of the eleventh transistor is coupled to the output terminal of the pull-down control unit, and a second electrode of the eleventh transistor is coupled to the first node; and
a control electrode of the twelfth transistor is coupled to the first node, a first electrode of the twelfth transistor is coupled to the fourth power supply terminal, and a second electrode of the twelfth transistor is coupled to both the output terminal of the pull-down control unit and the first electrode of the eleventh transistor.

12. A gate drive circuit, comprising: a plurality of shift registers which are cascaded, and a first clock signal line, a second clock signal line, a third clock signal line, and a fourth clock signal line, which are respectively coupled to the plurality of shift registers, for providing clock signals, wherein each of the shift registers is the shift register of claim 1, wherein
the signal output terminal of the shift register of a stage, other than the shift register of a first stage and the shift register of a last stage, is coupled to the reverse-scan input signal terminal of the shift register of a previous stage and the forward-scan input signal terminal of the shift register of a next stage;
the first control signal input terminal of the shift register of the $(4n-3)^{th}$ stage is coupled to the first clock signal line, the second control signal input terminal of the shift register of the $(4n-3)^{th}$ stage is coupled to the second clock signal line, the third control signal input terminal of the shift register of the $(4n-3)^{th}$ stage is coupled to the third clock signal line, and a fourth control signal input terminal of the shift register of the $(4n-3)^{th}$ stage is coupled to the fourth clock signal line;

the first control signal input terminal of the shift register of the $(4n-2)^{th}$ stage is coupled to the second clock signal line, the second control signal input terminal of the shift register of the $(4n-2)^{th}$ stage is coupled to the third clock signal line, the third control signal input terminal of the shift register of the $(4n-2)^{th}$ stage is coupled to the fourth clock signal line, and the fourth control signal input terminal of the shift register of the $(4n-2)^{th}$ stage is coupled to the first clock signal line;

the first control signal input terminal of the shift register of the $(4n-1)^{th}$ stage is coupled to the third clock signal line, the second control signal input terminal of the shift register of the $(4n-1)^{th}$ stage is coupled to the fourth clock signal line, the third control signal input terminal of the shift register of the $(4n-1)^{th}$ stage is coupled to the first clock signal line, and the fourth control signal input terminal of the shift register of the $(4n-1)^{th}$ stage is coupled to the second clock signal line;

the first control signal input terminal of the shift register of the $(4n)^{th}$ stage is coupled to the fourth clock signal line, the second control signal input terminal of the shift register of the $(4n)^{th}$ stage is coupled to the first clock signal line, the third control signal input terminal of the shift register of the $(4n)^{th}$ stage is coupled to the second clock signal line, and the fourth control signal input terminal of the shift register of the $(4n)^{th}$ stage is coupled to the third clock signal line; and n is a positive integer.

13. A display device, comprising the gate driver circuit according to claim 12.

14. A forward driving method of a shift register, wherein the shift register is the shift register of claim 1, and the forward driving method comprises:
- an input stage, in which the first input unit inputs a forward-scan input signal provided from the forward-scan input signal terminal to the first node under the control of the control signal provided from the first control signal input terminal, and the pull-up control unit inputs the control signal provided from the fourth control signal input terminal to the second node under the control of the potential of the first node;
- an output stage, in which under the control of the potential of the first node, the output control unit transmits the control signal provided from the second control signal input terminal to the signal output terminal for the signal output terminal to output a scan signal; and
- a reset stage, in which the pull-up control unit inputs a first voltage provided from the first power supply terminal to the second node under the control of the control signal provided from the fourth control signal input terminal, and the output reset unit inputs, under the control of the potential of the second node, a third voltage provided from the third power supply terminal to the signal output terminal to reset the signal output terminal.

15. A reverse driving method of a shift register, wherein the shift register is the shift register of claim 1, and the reverse driving method comprises:
- an input stage, in which the second input unit inputs the reverse-scan input signal provided from the reverse-scan input signal terminal to the first node under the control of the control signal provided from the third control signal input terminal, and the pull-up control unit inputs the control signal provided from the fourth control signal input terminal to the second node under the control of the potential of the first node;
- an output stage, in which under the control of the potential of the first node, the output control unit transmits the control signal provided from the second control signal input terminal to the signal output terminal for the signal output terminal to output a scan signal; and
- a reset stage, in which the pull-up control unit inputs the first voltage provided from the first power supply terminal to the second node under the control of the control signal provided from the fourth control signal input terminal, and the output reset unit inputs, under the control of the potential of the second node, the third voltage provided from the third power supply terminal to the signal output terminal to reset the signal output terminal.

16. The shift register of claim 1, wherein the pull-down control unit includes a fifth transistor, and
a control electrode of the fifth transistor is coupled to the second node, a first electrode of the fifth transistor is coupled to the second power supply terminal, and a second electrode of the fifth transistor is coupled to the first node.

17. The shift register of claim 1, wherein the first input unit comprises: a first transistor, and
a control electrode of the first transistor is coupled to the first control signal input terminal, a first electrode of the first transistor is coupled to the forward-scan input signal terminal, and a second electrode of the first transistor is coupled to the first node.

18. The shift register of claim 1, wherein the second input unit comprises a second transistor, and
a control electrode of the second transistor is coupled to the third control signal input terminal, a first electrode of the second transistor is coupled to the reverse-scan input signal terminal, and a second electrode of the second transistor is coupled to the first node.

* * * * *